United States Patent [19]
Gueble et al.

[11] Patent Number: 5,339,939
[45] Date of Patent: Aug. 23, 1994

[54] POCKET TAPE FEEDER SYSTEM

[75] Inventors: Jeffrey R. Gueble, Seattle; Mark S. Soderberg, Issaquah, both of Wash.

[73] Assignee: CNA Manufacturing Systems, Inc., Redmond, Wash.

[21] Appl. No.: 938,875

[22] Filed: Aug. 31, 1992

[51] Int. Cl.$^5$ .............................................. B65G 15/64
[52] U.S. Cl. .......................... 198/345.2; 198/803.14
[58] Field of Search ............ 198/345.1, 245.2, 803.14

[56] References Cited

U.S. PATENT DOCUMENTS

| | | |
|---|---|---|
| 3,447,036 | 5/1969 | Dore et al. |
| 3,545,606 | 12/1970 | Bennett et al. |
| 3,807,045 | 4/1974 | Bennett et al. |
| 3,949,925 | 4/1976 | Keizer et al. |
| 4,166,562 | 9/1979 | Keizer et al. |
| 4,397,385 | 8/1983 | Booth et al. ........................ 198/345.1 |
| 4,516,673 | 5/1985 | Kashihara et al. ............ 198/345.1 X |
| 4,610,083 | 9/1986 | Campisi et al. |
| 4,617,728 | 10/1986 | Andersen et al. |
| 4,633,370 | 12/1986 | Hamuro et al. |
| 4,810,154 | 3/1989 | Klemmer et al. |
| 4,943,342 | 7/1990 | Golemon. |
| 5,058,721 | 10/1991 | Koibuchi ........................... 198/345.1 |
| 5,087,877 | 2/1992 | Frentz et al. |
| 5,119,934 | 6/1992 | Karasawa et al. |
| 5,125,503 | 6/1992 | Ueberreiter et al. ........ 198/803.14 X |
| 5,163,222 | 11/1992 | Imlig et al. .................... 198/345.2 X |
| 5,191,693 | 3/1993 | Umetsu .......................... 198/803.14 X |

OTHER PUBLICATIONS

"Announcing a New Era in Electronic Assembly", advertising brochure from the Robodyne Corporation, Minneapolis, Minn. *Publication date unknown.*

*Primary Examiner*—D. Glenn Dayoan
*Attorney, Agent, or Firm*—Dellett and Walters

[57] ABSTRACT

A component pocket tape feeder system employs a registration mechanism to precisely position a component within a pocket tape just prior to retrieval of the component by a robotic assembly device. The registration mechanism precisely aligns the part thus enabling the robot to locate the part. The registration mechanism includes hold down and tamp apparatus for preventing tumbling of the part during alignment and an alignment mechanism which extends through apertures in the component tape to engage portions of the component and move the component, which was theretofore loosely held within the tape. The alignment mechanism is removable to allow other alignment mechanisms to be attached to the system to enable use with various components.

16 Claims, 7 Drawing Sheets

POCKET TAPE FEEDER SYSTEM

BACKGROUND OF THE INVENTION

This invention relates to component pocket tape feeding systems and more particularly to a component pocket tape feeding system which precisely aligns the component within the pocket for enabling retrieval of the component.

Automation of electronic assembly provides reduced costs and increased reliability. However, with such automation, the need to supply parts to automatic assembly devices arises. Thus, several prior art methods of providing precise alignment of components to enable retrieval by assembly apparatus have been devised. One method employs a flat tape within which precision holes are punched for receiving portions of the components, typically the component leads. Then, through precise feeding of the tape, the exact location of a particular component can be known because the component is precisely positioned relative to the tape. There are, however, drawbacks to this method. Most importantly the components must be precisely loaded with respect to the tape, leading to expensive production. Further, it is necessary to provide complex machines to precisely form the holes in the tape as well as to ensure that components are accurately positioned within the preformed holes. Such an arrangement often leaves the component leads exposed and subject to damage. Automated part retrieving machines typically need to have the part positioned to within plus or minus 1/1000th of an inch to avoid having to reposition the part when it is picked up. With the previously discussed flat tape method, machines to precision load the tape must be able to place components into the tape to within 5/10,000th of an inch tolerance.

As an attempt to avoid the costs attendant with the previously discussed method, component manufacturers often will opt to perform manual unloading of the component tape wherein the component tape is not loaded with any particular precision. The individual components are removed from the tape and are placed within feeder trays which are then supplied to an assembly machine and the feeder trays provide the desired precise positioning of the parts. However, this method results in high labor costs.

Another problem with the previously discussed film tape is that the method is not adapted to surface mount devices which typically do not have leads extending downwardly that fit within precision formed holes in the carrier tape. Also, the surface mount device components may be fragile and may have extending portions needing protection from damage which might result from contact with a hard surface. Employing the prior art film tape does not provide such protection and could lead to deformation of sensitive component portions.

As an attempt to provide improved automated feeding of surface mount devices, a pocket component tape has been developed wherein the tape is provided with a pocket which receives the part. A top cover layer is then applied to hold the part within the pocket during storage and transit. However, many of the same problems attendant with the heretofore used tapes also arise with the pocket component tape. Namely, the part must either be precisely positioned within the component tape pocket, leading to expensive loading costs, or the components must be manually removed from the pocket tape and placed into assembly trays for retrieval.

Another method for removing parts from the component tape employs an expensive vision system. This system employs computer vision to ascertain the position and orientation of the part. Then, a mechanism is positioned to retrieve the part from its location and reposition the part to a known orientation for further use in the assembly process.

Thus, while several methods of providing components have been employed, typically the components are not precisely placed within a carrier, and the part is removed from the carrier pocket and then precisely aligned either manually or through use of an expensive vision and pattern recognition system. Alternatively, if the part is precisely aligned within the carrier, the cost of loading parts is high or else the methods are not suitable to surface mount devices.

SUMMARY OF THE INVENTION

In accordance with the present invention, a component pocket tape feeder system employs a registration mechanism to precisely align individual parts within the pocket tape just prior to retrieval to supply the part in a known position such that a robotic device can retrieve the part from the pocket tape, thereby enabling the part to be loaded into the tape in a non-precision manner. The registration mechanism suitably comprises three pneumatically-actuated registration devices. The first, an alignment device, moves vertically from below the pocket tape to skewer the component on alignment pins. The second and third mechanisms, a hold down actuator carrying a tamp actuator, engage the component from above to prevent the component from tumbling within the tape or moving up out of the tape during engagement of alignment pins. The tamp actuator ensures even pressure on the part to prevent binding when the alignment pins engage. Sequencing of the operations is provided by programmable logic controllers, and a sensor detects whether a part is actually present in the tape pocket. Movement of the pocket tape through the apparatus is performed via a stepper motor which drives a toothed gear adapted to engage sprocket holes within the component tape. The system allows variable tape advance distances to accommodate different tapes with components which may have different spacings between the various pockets. Also supplied are dereel and take up reel mechanisms for unreeling the component tape, removing the cover of the component tape and collecting and reeling up the component tape cover and component bottom portion.

It is accordingly an object of the present invention to provide an improved component tape feeder system.

It is a further object of the present invention to provide an improved component tape feeder system which enables components to be loosely loaded within the tape while still enabling precise positioning for retrieval.

It is a further object of the present invention to provide an improved component tape feeder system which precisely positions components just prior to retrieval of the component from the tape.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

BRIEF DESCRIPTION OF THE DRAWINGS

FIG. 8 is a more detailed side view of the alignment pin portion of the registration mechanism illustrating the interchangeability of the alignment pins;

DETAILED DESCRIPTION

Figure 1:
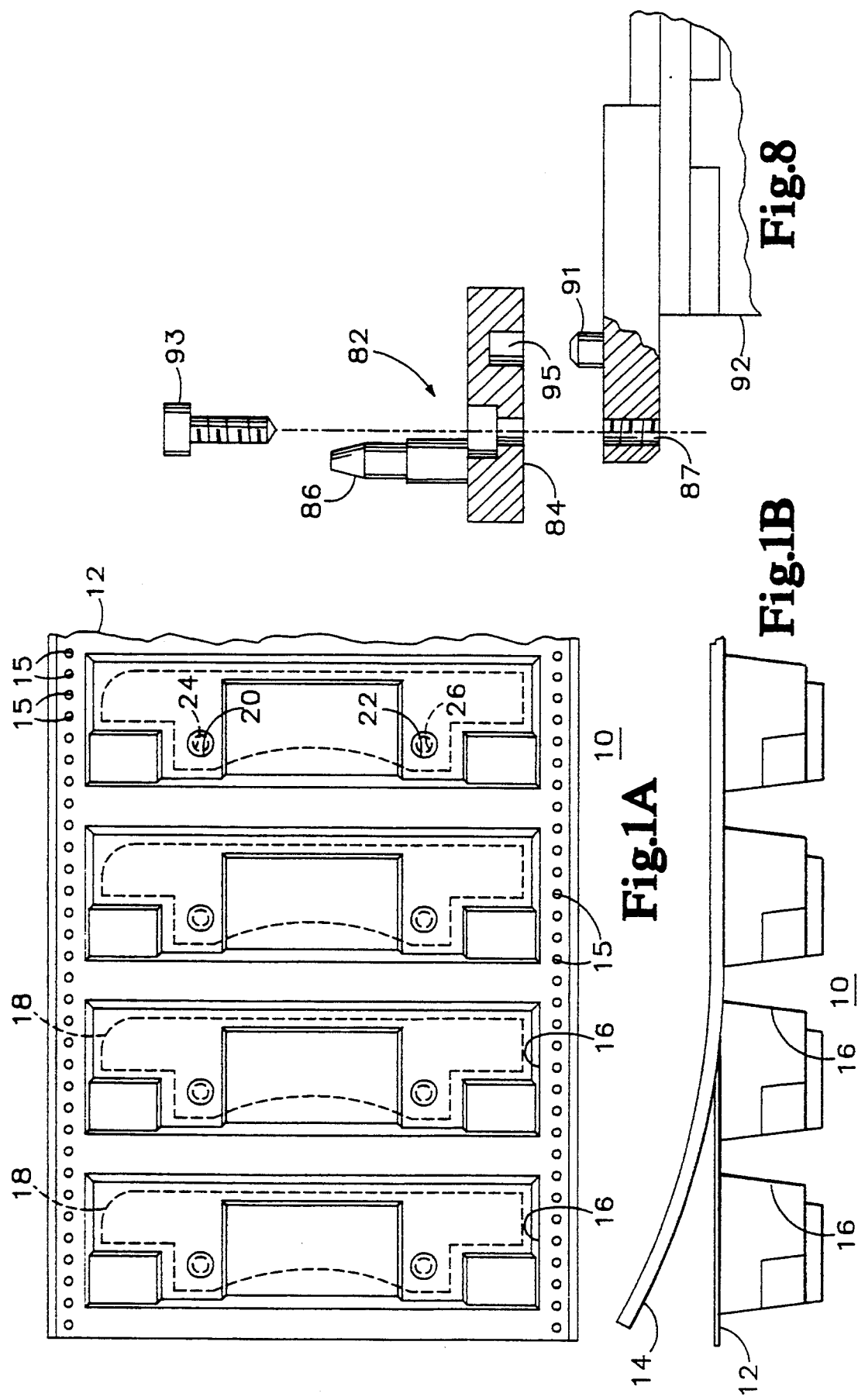
FIG. 1A is a top view of pocket tape as employed with the present invention, with the cover removed, illustrating components therein.
FIG. 1B is a side view of a portion of pocket tape.

FIGS. 1A and 1B are top and side views respectively of component pocket tape with components installed therein illustrated in phantom in FIG. 1A. The component tape 10 includes a bottom portion 12 and a detachable tape cover 14 (shown removed in FIG. 1A). The tape cover engages the tape bottom 12 such that the cover is in place during transportation of the tape and is then removed once the components are to be taken out of the tape pockets for installation or other use. The tape is reasonably flexible and is provided in rolls with components pre-loaded therein.

The bottom portion of the tape includes a plurality of recessed pocket areas 16 adapted to receive and loosely engage parts 18 (shown in phantom). The particular dimensions of the recessed portion 16 will vary depending upon the particular part 18 which is held within the component tape. The pocket dimensions are suitably such that the part is somewhat loosely received therewithin allowing, for example, approximately 1/32 of an inch movement of the part in any particular direction within the pocket. The shape of the pocket, e.g. with tapering walls, is also such that, even though some movement is allowed, vulnerable portions of the particular component will not be allowed to contact the walls of the tape, thereby insuring fragile component portions are not damaged. For example, surface mount connector devices may have very easily bent connecting pins which need to be protected during shipping. The component pocket tape includes alignment holes 20 and 22 which are placed within the bottom of each individual pocket of the tape so as to provide alignment with a pair of corresponding smaller mounting holes 24 and 26 in the component carried within the pocket.

The holes 20 and 22 allow a registration mechanism to precisely position the part within the component tape at a pick-up station for enabling a robotic pick-up device to remove the part from the component tape. The configuration and operation of the registration mechanism is described hereinbelow with reference to FIGS. 3-9.

The placement of the holes in the pocket is dependent upon the particular part being carried by the tape and each different part may have a somewhat different configuration; for example, there may be a different number of holes in the tape and in the part other than two as illustrated. Also, the holes may be of different shape and may be physically located in different positions. The component tape bottom portion 12 also has a plurality of feeder holes or indentations 15 which run along each longitudinal edge of the tape, providing a means for engaging the tape so as to allow feeding as will be discussed hereinbelow with reference to FIG. 2.

Figure 2:
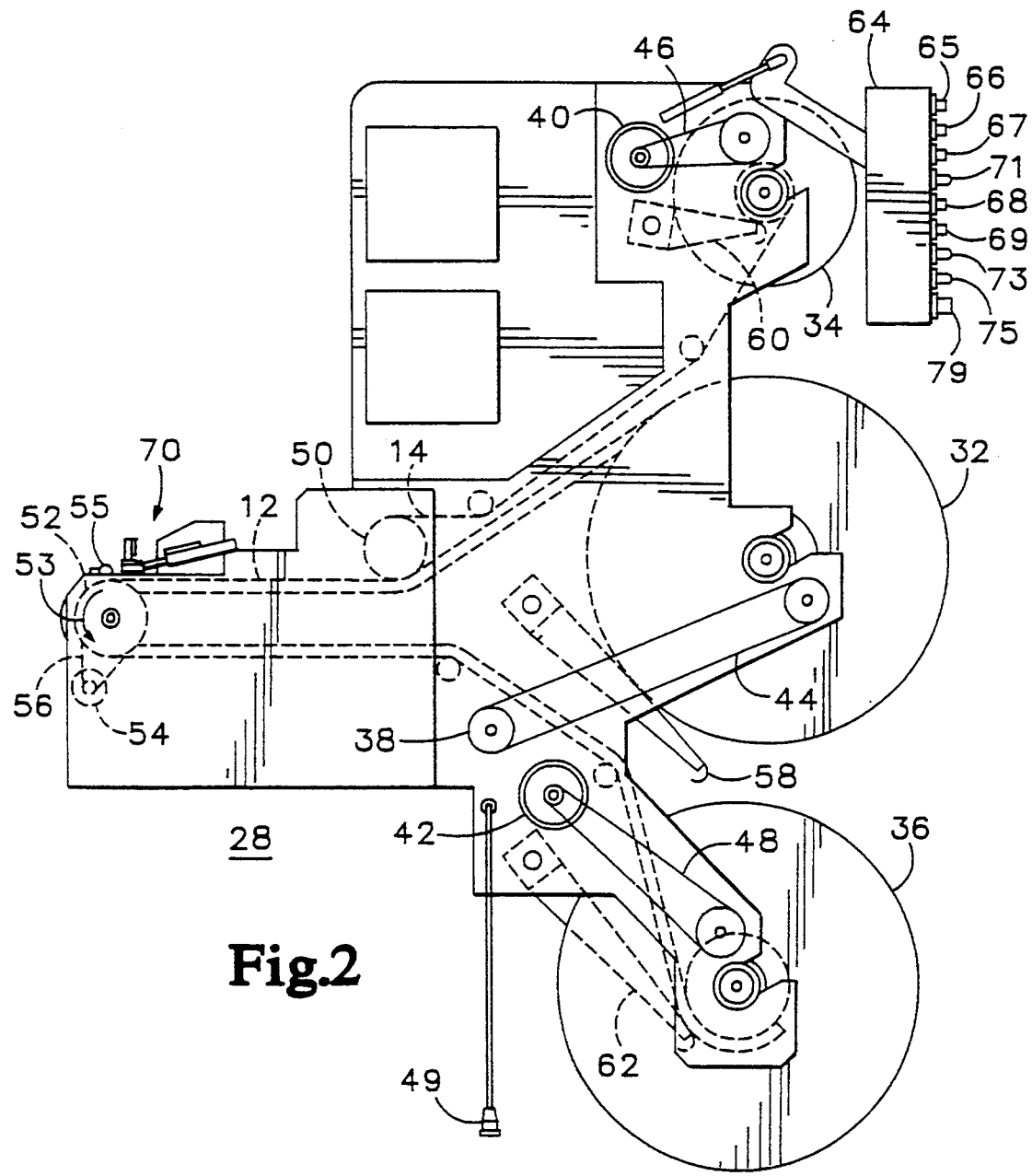
FIG. 2 is an overall view of the pocket tape feeder system.

Referring now to FIG. 2, an overall view of the component tape feeder system of the present invention, the component tape feeder 28 includes a rotatably mounted reel 32 of component tape. The system 28 is also provided with a cover takeup reel 34 for receiving the component tape cover, while a second takeup reel 36 receives the bottom portion of the component tape after components have been extracted therefrom. Each of reels 32, 34 and 36 is driven by a respective motor 38, 40 or 42, each motor driving a belt 44, 46 and 48 to rotationally empower the appropriate reel.

The component tape feeder system 28 further employs a cover removing mechanism 50 for separating the component tape cover 14 from the component tape bottom portion 12. A series of guides directs the component tape cover to the takeup reel 34. Tape feeder 28 is further provided with a tape sprocket wheel 52 which includes a plurality of teeth thereon for engaging the tape feeder holes 15. While only one such sprocket wheel is visible in FIG. 2, the tape feeder employs a pair of aligned sprocket wheels, one for each side of tape 12. One of the sprocket wheels 52 is powered by stepper motor 54 wherein power transfer from the motor to the sprocket is accomplished via drive belt 56. The second sprocket wheel is driven via square axle 83 (FIG. 3) joining the sprocket wheels. The component tape feeding mechanism also includes a roller wheel 55 (FIG. 3) in engaging relation with sprocket wheel 52 and functioning to ensure the component tape is in firm engagement with the teeth of the sprocket wheel in order to guard against slippage.

Each of the reels, dereel 32, cover reel 34 and takeup reel 36 includes a reel size measurement member 58, 60 or 62, which is suitable for providing feedback to enable adjustment of tension of motor 38, 40 or 42 for keeping the respective component tape constituents tightly wound on a reel during operation of the system. A control panel 64 is suitably provided with a number of control switches and indicators for directing operation of the machine, including on/off switch 65, manual/automatic switch 66, cycle/jog switch 67 enabling the tape feed to jog ahead for alignment purposes or to cycle through one complete pocket advance, cover motor on/off switch 68, and take up motor on/off switch 69. Indicators suitably comprise power on light 71, error light 73 and low part light 75. Pitch set 79, which may comprise a thumb wheel switch, allows the distance the tape is advanced during feeding to be varied. Interface cable 49 allows external devices to control and monitor operation of the component tape feeder system.

In operation, a reel of pocket tape 32 with components installed therein and including a tape cover is loaded onto the system and the component tape is fed through to cover remover 50. At this point, cover remover 50 removes the tape cover 14 ant the same is fed to takeup reel 34. Bottom portion 12 of the component tape continues on and is fed around sprocket wheels 52. The tape loops around wheels 52 and is fed back so as to be wound by takeup reel 36 for disposal (or reuse) once the reel is full. Sprocket wheels 52 advance the tape in the direction of arrow 53 in normal operation until a pocket holding a part is located at a registration mechanism 70. Once the part is appropriately positioned at the registration mechanism, that mechanism precisely aligns the part within the pocket to enable the part to be retrieved by, for example, a robot or other such assembly device for picking up the part from the pocket tape. After the part has been removed from the tape, the tape is ready no advance to appropriately position a subsequent part at the registration mechanism on demand via issuance of a feed signal, discussed with reference to FIG. 10.

Figure 3:
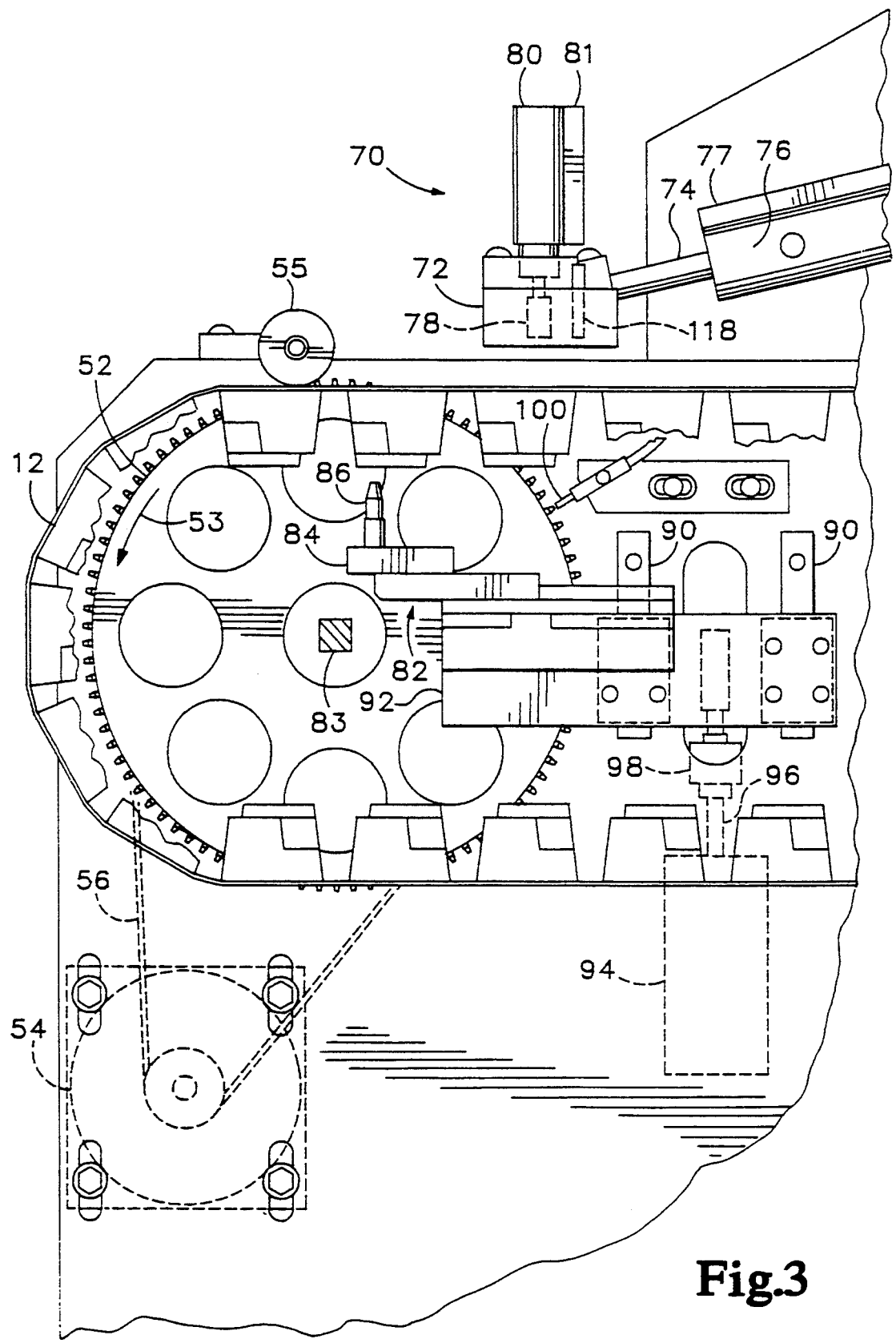
FIG. 3 is a side partial sectional view of the tape feeding and registration mechanism.

FIG. 3, which is a partial side sectional view of the tape feeding and component registration mechanisms, illustrates the various components of the registration mechanism in greater detail. The registration mechanism 70 includes a hold down member 72 mounted to retractable rod 74, powered by pneumatic cylinder 76. The pneumatic cylinder 76 and rod 74 are suitably oriented at approximately a ten degree angle relative to the plane of travel of the component tape, although this is not a requirement and an alternative embodiment could mount the cylinder and rod at another angle. Hold down member 72 of the registration mechanism carries tamp member 78 that is translatable vertically as powered by pneumatic cylinder 80, operative to extend and retract the tamp member. Hold down member 72 is provided to prevent the part from tumbling within the pocket when the alignment pins (described below) begin to engage the part. Further, the tamp mechanism provides pressure on top of the part to ensure that no mispositioning occurs when alignment pins engage the particular component.

Figure 9:
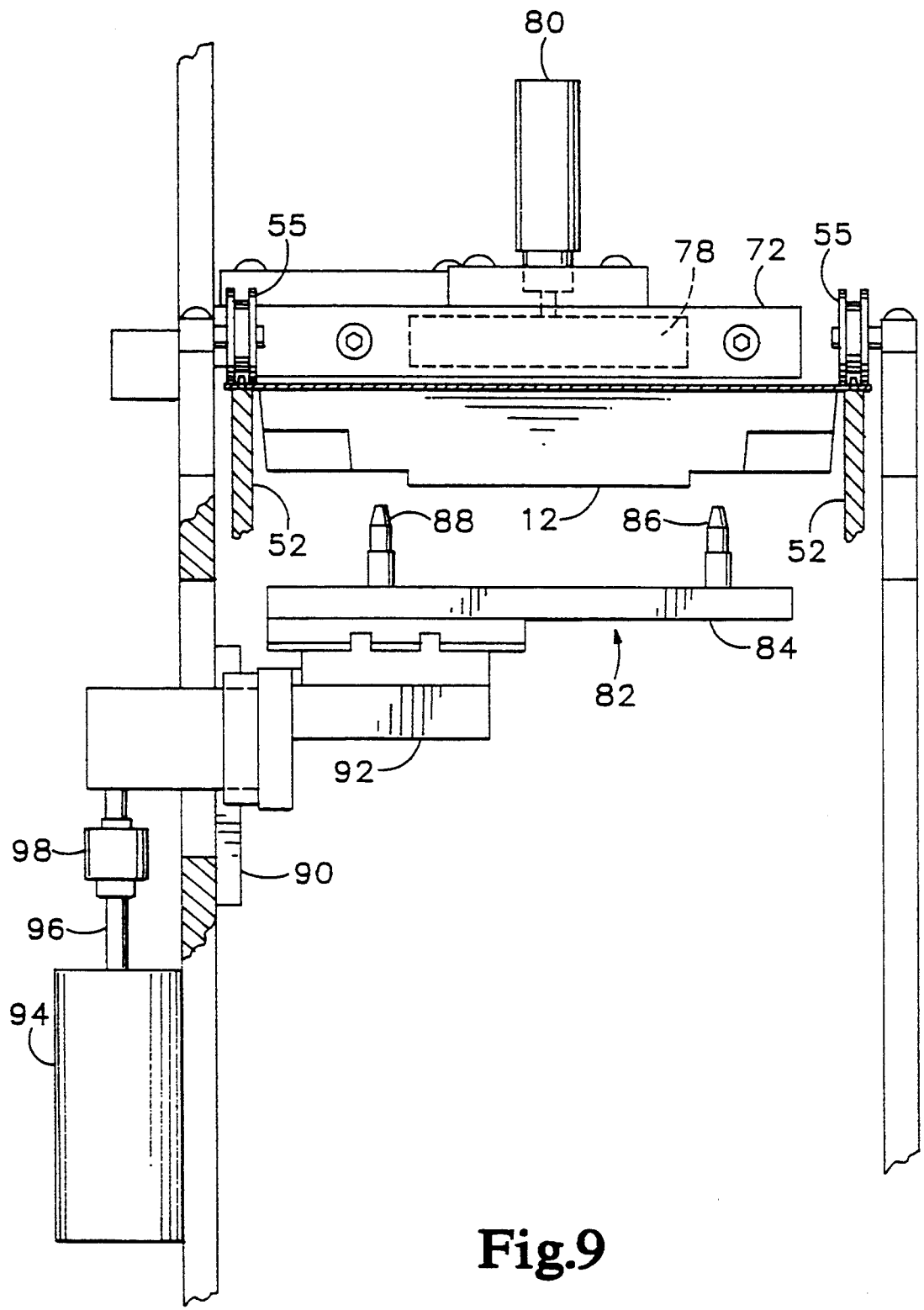
FIG. 9 is an end view of the alignment pin assembly of the registration mechanism.

The registration mechanism may be better understood with reference to FIG. 3 taken together with FIG. 9, the latter comprising an end view of alignment member 82. The alignment member comprises a base 84 which carries alignment pins 86 and 88 disposed at positions along base 84 so as to be alignable with the holes 20 and 22 in the component tape and the part holes 24 and 26 (FIG. 1A). Alignment member 82 is slidably mounted between a pair of linear ways 90 carried by support member 92. Linear ways 90 allow vertical translation of the entire alignment portion 82 and support member 92. Support member 92 is engaged by a pneumatic cylinder 94 including an extension rod 96. Rod 96 is coupled to support 92 via a swivel coupling (e.g., a ball joint 98) firmly mounted to both rod 96 and base 92.

Referring again particularly to FIG. 3, another element of the component tape feeder system comprises tooth sensor 100, for example, a fiber optic reflective sensor for detecting teeth on sprocket 52 for providing feedback to enable appropriate control of tape advance.

Figure 4:
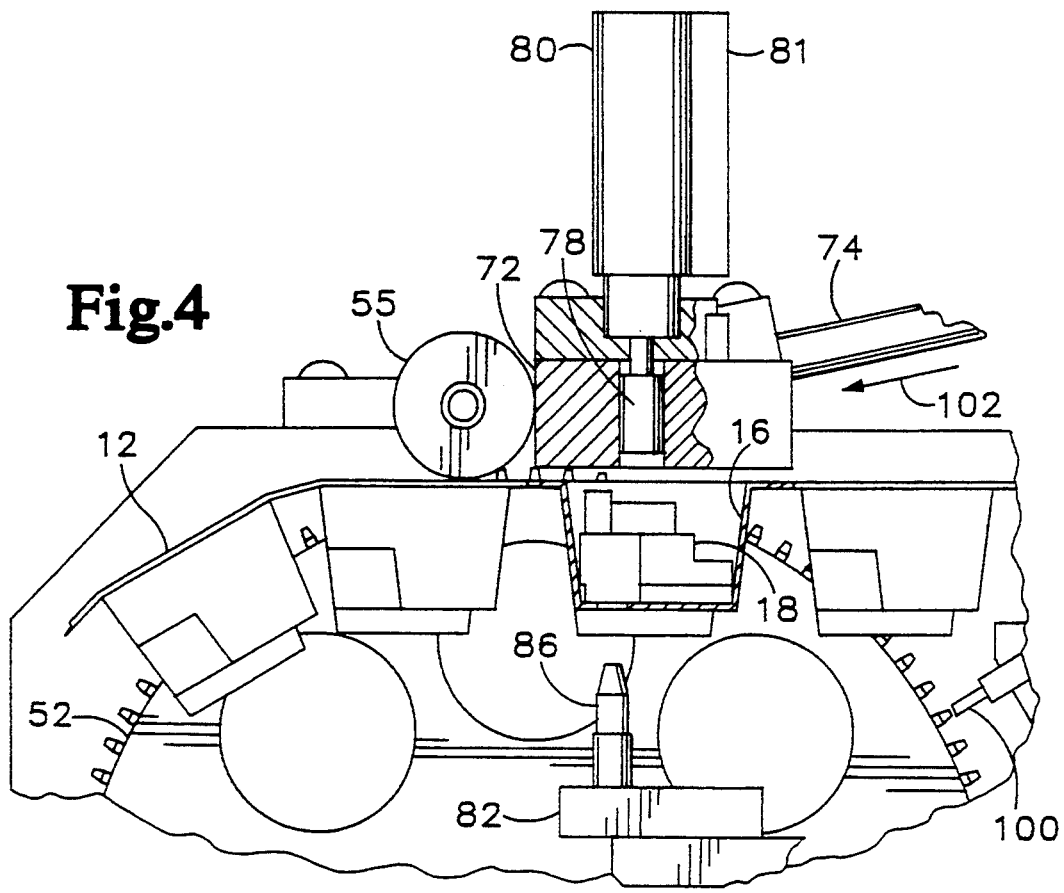
FIG. 4 is a more detailed side partial sectional view of the tape feeding and registration mechanism with the hold down in an extended position.

FIGS. 3 through 7, taken together, illustrate states of the registration mechanism during alignment of a part within an individual pocket of the component. In FIG. 3 the various portions of the registration mechanism are in the retracted state, i.e., before the aligning of a part has begun. First, the pocket and part are roughly aligned by means of tooth sensor 100. Thus the tape is roughly advanced by counting sprocket teeth during sprocket rotation until the tape has been advanced to place a next pocket containing a next part at the registration mechanism. In FIG. 4, the next step of the component alignment procedure takes place wherein hold down member 72 advances in the direction of arrow 102, via operation of pneumatic cylinder 76 and the resulting extension of rod 74. The hold down member including the tamp member advances until the assembly is close to, but has not yet fully contacted, the part. Limit switch 77 (FIG. 3) on pneumatic cylinder 76 provides feedback to indicate when the hold down is in this position.

The system is designed such that the top of the part is always in the same position when supplied by the pocket tape. Accommodation for different sizes of parts is accomplished by varying the depth of pocket 16 of the component tape to ensure that the top of the part is so presented.

Figure 5:
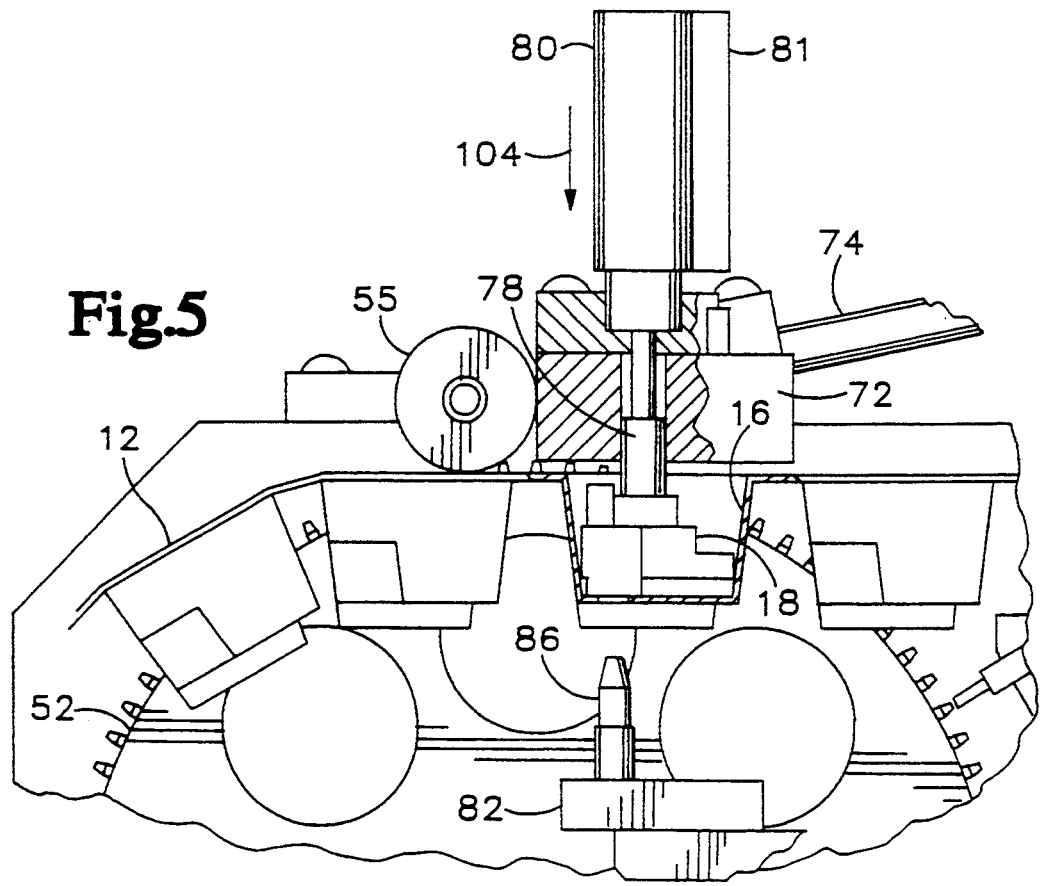
FIG. 5 is a more detailed side partial sectional view of the tape feeding and registration mechanism with the hold down and tamper in extended positions.

Referring now to FIG. 5, the next step in the registration operation is the extension of the tamp member 78 in the direction of arrow 104 causing the tamp member to rest against the top of the part. Limit switch 81 suitably detects when the tamp has extended to this point.

Figure 6:
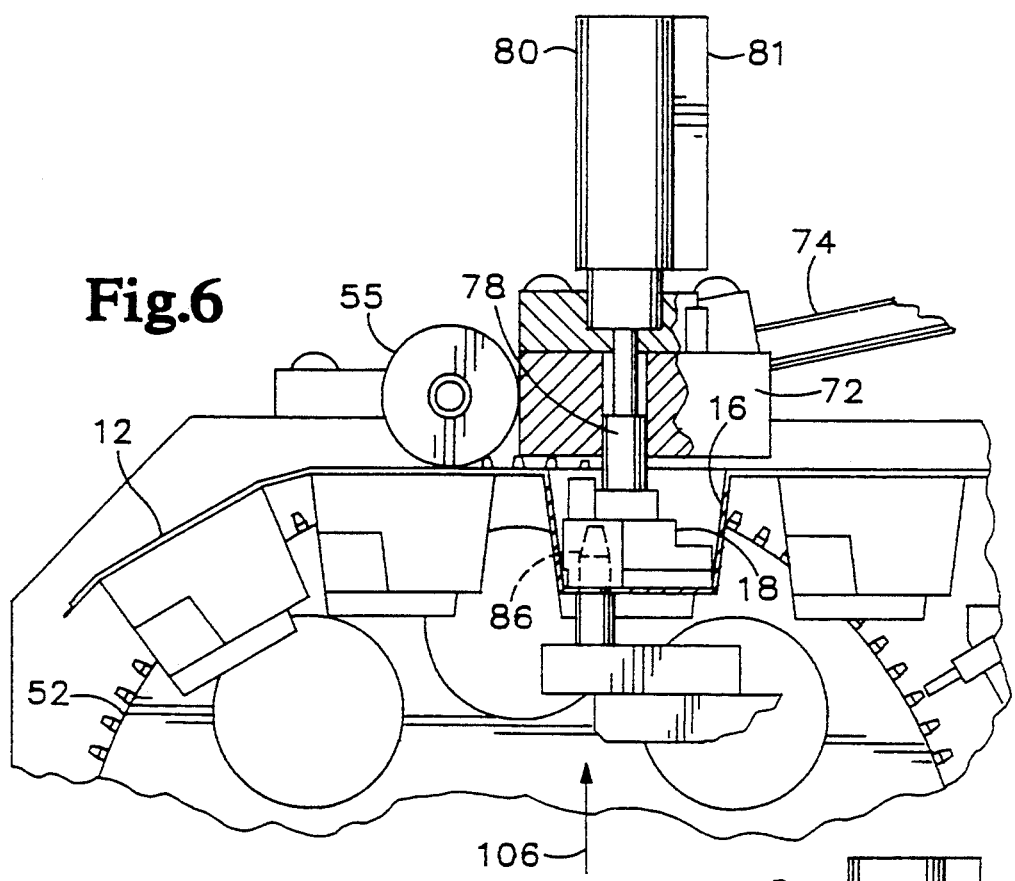
FIG. 6 is a more detailed side partial sectional view of the tape feeding and registration mechanism with the hold down and tamper in extended positions and with the alignment pins in the engaged position.

With reference to FIG. 6, subsequent to operation of the tamp, the alignment apparatus 82 extends upwardly in the direction of arrow 106 in response to actuation of pneumatic cylinder 94 (FIGS. 3 and 9). This upward extension of the alignment portion causes tapered alignment pins 86 and 88 to pass through pocket tape holes 20 and 22 so as to engage the holes 24 and 26 (FIG. 1A) within the part 18 carried within the component tape. The lower portions of the alignment pins slidably mate with the holes 24 and 26, while the upper ends of the pins (which will extend above the holes in the part) taper to a smaller diameter so as to easily enter holes 24 and 26. Full engagement accurately positions the component inasmuch as the positions of pins 86 and 88 are precisely known.

Figure 7:
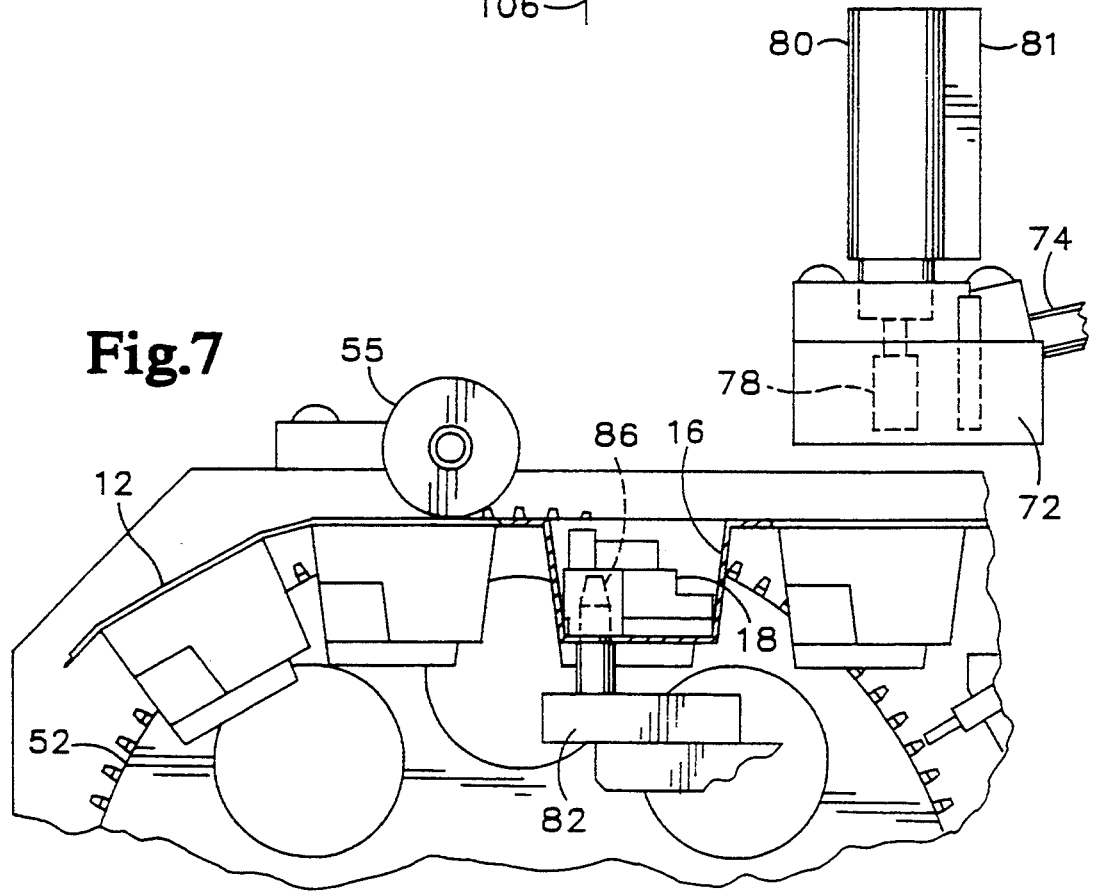
FIG. 7 is a side partial sectional view of the tape feeding and registration mechanism with the hold down and tamper mechanism in the retracted position illustrating the component in an aligned position.

Once the pins have thus engaged the part, the system pauses, for example for thirty milliseconds, and a part detector 118 (FIG. 3) checks to ascertain whether a part is present in the particular pocket. Part detector 118 suitably comprises a photoelectric device for merely indicating the presence or absence of a part. If a part is present, tamp 78 is retracted followed by the retraction of the hold down 72 (via reverse operation of pneumatic cylinders 80 and 76) while pins 86 and 88 remain up. The system is then in a state as illustrated in FIG. 7 with the top part of the pocket unobstructed and the part positioned on pins 86 and 88. At this point, the part is precisely positioned (to within 1/1000 of an inch in a particular embodiment) and is suitably picked up by a robot for use in an assembly. Alignment member 82 carrying pins 86 and 88 is retracted and the tape is advanced. If no part was present in the pocket, tamp 78, hold down 72 and alignment member 82 of the registration mechanism all three retract and the pocket tape is advanced to position the next pocket at the alignment area.

Referring to FIG. 8 comprising a more detailed view of the alignment pin portion 82, alignment base 84 is adapted to be removably mounted to alignment support 92 via a pair of knurled bolts 93 which engage threaded portions 87 in the alignment support 92. Also provided are a pair of dowel pins 91 which project upwardly from the alignment base so as to engage corresponding holes 95 in the alignment member 82. Therefore, the alignment pins 86 and 88 may be removed and accurately replaced with a new alignment member 82 which has differently sized, shaped or spaced alignment pins whereby the component tape feeder is adapted for feeding different parts having different dimensions and differing spacings of the point of engagement from the alignment mechanism. When changing the system to adapt for a differently shaped part, modifications to allow for height variations in the part are accomplished by changes to the component pocket tape pocket 16 so that the top of the part is positioned at substantially the same level for any particular part.

Figure 10:
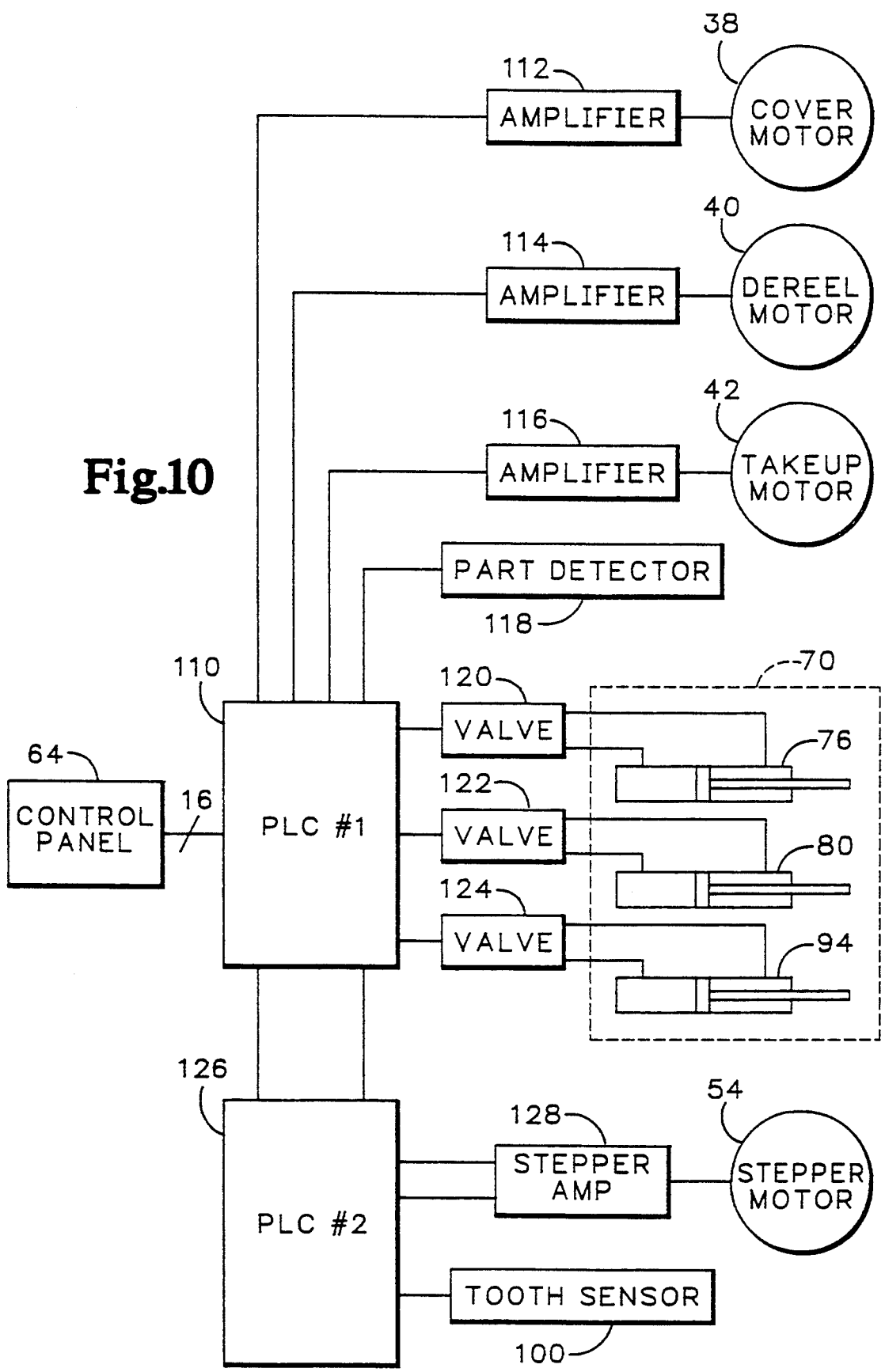
FIG. 10 is a block diagram of the component tape feeder system of the present invention.

Referring now to FIG. 10, a block diagram of the overall electrical and control system of the component tape feeder, a main programmable logic controller 110 interfaces with control panel 64 and directs operation of the system based on the various states of the controls. The programmable logic controller interacts with the control panel by reading the condition of switches on the panel including the pitch thumb wheel 79 setting which directs the amount by which sprocket wheels 52 rotate during a tape feeding operation between pockets, thus allowing the system to adapt to different spacing between pockets in the component tape. The programmable logic controller supplies signals to cover motor amplifier 112, dereel motor amplifier 114 and takeup motor amplifier 116. Amplifier 112 governs operation of cover motor 38. Similarly, dereel motor amplifier 114 controls operation of dereel motor 40 while takeup motor amplifier 116 empowers takeup motor 42. Programmable logic controller 110 also receives input from part detector 118 that determines when a part is present at the registration mechanism. A series of three valves is directed by programmable logic controller 110 wherein valve 120 controls pneumatic cylinder 76 operation, valve 122 controls pneumatic cylinder 80 and valve 124 governs operation of pneumatic cylinder 94. Valves 120, 122 and 124 cause respective pneumatic cylinders 76, 80 and 84 to extend, hold position, or retract to carry out the procedure as described.

Programmable logic controller 110 is coupled to a second programmable logic controller 126. Logic controller 126 is responsible for operation of the stepper motor 54 which controls the movement of tape feeder sprocket 52, the logic controller 126 directing operation of the stepper motor via stepper amplifier 128. Programmable logic controller 126 receives input from tooth sensor 100 for detecting the position of sprocket 52.

The programmable logic controller 110 coordinates the machine's operation, including the stepper subsystem (which comprises programmable logic controller 126, amplifier 128, stepper motor 54 and tooth sensor 100). Moreover, controller 110 directs feeding of pocket tape, the takeup, cover and dereel motors, interfacing with the control panel, and directing operation of the registration mechanism in the sequence described.

The stepper subsystem programmable logic controller 126 interacts with the programmable logic controller 110 based on a series of interface signals. The first signal, AUTOMAN, is responsive to the auto/manual switch 66 position on the control panel and directs the stepper subsystem to either index the sprocket (i.e., advance the sprocket) by a single tooth (manual) or to index the sprocket according to the preset pitch count. The pitch count, as set by thumb wheel switch 79 on the main control panel, allows adjustment of the system to accommodate varying spacings of components in component tape. A signal, FEED, is used by programmable logic controller 110 to initiate an indexing cycle by the stepper subsystem whereupon a feed signal will cause the programmable logic controller 126 to advance sprocket 52 by a number of teeth corresponding to a selected pitch. The programmable logic controller 126 stepper subsystem uses a READY signal to acknowledge any of the aforementioned signals from programmable logic controller 110.

In operation, programmable logic controller 126 drives stepper motor 54 through an ICS bi-polar chopper drive. The drive accepts step and direction commands and during indexing, the programmable logic controller 126 monitors input from tooth sensor 100 to provide feedback concerning the position of the sprocket drive. During automatic operation, the position of the sprocket drive is compared with preset pitch to determine the appropriate stopping point.

The feeding sequence of the device is suitably responsive to a feed signal supplied, e.g. via interface cable 49 from a robotic component retriever, such that successive components are fed and aligned with the registration mechanism in response to operation of the robot. Then, once the component is precisely aligned, the robot retrieves the part for assembly for removing the part the component pocket at the position for the system as illustrated in FIG. 7. Then the tape is advanced.

An alternative embodiment of the component tape feeding system provides a chopping mechanism in place of the take up reel, to chop the component tape into small pieces after the parts are removed therefrom, for enabling disposal or appropriate recycling. Similarly, the tape cover may be chopped or shredded as desired.

An improved component pocket type feeder is provided which precisely aligns the part within the pocket just prior to retrieval, enabling parts to be inexpensively loaded into component tape without positional precision, while allowing precise positioning during unloading of the pocket tape. The unloading can thereby be automated for reducing assembly costs.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

We claim:

1. Apparatus for automated feeding of components wherein the components are supplied in a continuous strip of component pocket tape, wherein said component pocket tape has at least one aperture therein, the apparatus comprising:
    means for advancing the continuous strip of component pocket tape to position an individual pocket of the component pocket tape in the vicinity of a component pickup area; and
    registration means adapted to align a component within a pocket to a predetermined position at said component pickup area, where said registration means comprises positioning means operative to pass through the component tape aperture to engage the component for aligning the component at the known position.

2. Apparatus according to claim 1 wherein said registration means further comprises means for stabilizing the component against undesired movement during engagement by said positioning means.

3. Apparatus according to claim 1 wherein said registration means further comprises tamping means in opposing relation to the positioning means, said tamping means holding the component to ensure proper engagement of the positioning means with the component.

4. Apparatus according to claim 1 wherein said positioning means comprises at least one positioning pin operative to pass through the component pocket tape aperture so as to position the component.

5. A method for automated feeding of components wherein the components are supplied in a continuous strip of component pocket tape, wherein said component pocket tape has at least one aperture therein, comprising the steps of:

advancing the continuous strip of component pocket tape to position an individual pocket of the component pocket tape in the vicinity of a component pickup area; and aligning the component to a know position at said component pickup area, where said step of aligning comprises passing a positioning means through the component pocket tape aperture so as to engage the component, thereby aligning the component at the known position.

6. The method according to claim 5 wherein said step of aligning further comprises stabilizing the component against undesired movement during engagement by said positioning means.

7. The method according to claim 5 wherein said step of aligning further comprises tamping the component to ensure proper engagement of the positioning means with the component.

8. The method according to claim 5 wherein said step of aligning comprises passing at least one positioning pin through the component pocket tape aperture so as to engage and move the component to a precisely known position.

9. The method according to claim 5 further comprising the step of sensing whether a part is present in said individual pocket.

10. An apparatus for precisely positioning components carried within pockets of pocket component pocket tape during extraction of the components from the pocket component tape comprising:

a component tape drive for moving the pocket component tape through a component pickup area; and a registration mechanism adapted to align a component within a pocket to a predetermined position said registration mechanism comprising an alignment device adapted to engage a portion of the component, an actuator carrying tile alignment device for translating the alignment device from a disengaged position to an engaged position, and a tamping device mounted such that the component is disposed between the tamping device and the alignment device, for holding the component to ensure complete engagement between the component and the alignment device.

11. Apparatus according to claim 10 wherein said alignment device comprises at least one pin adapted to engage a portion of a component so as to position said component at a known location.

12. Apparatus according to claim 10 wherein said alignment device is interchangeable with a replacement alignment device, said replacement alignment device being adapted to engage a different component.

13. Apparatus according to claim 10 wherein said component tape drive comprises means for engaging the pocket component tape, and drive means powering said engaging means.

14. Apparatus according to claim 13 wherein said means for engaging comprises a sprocket wheel and wherein said drive means comprises a stepper motor in driving relation with said sprocket wheel.

15. Apparatus for automated feeding of components wherein the components are supplied in a continuous strip of component pocket tape, the apparatus comprising:

means for advancing the continuous strip of component pocket tape to position an individual pocket of the component pocket tape in the vicinity of a component pickup area; and registration means adapted to align a component within a pocket to a predetermined position at said component pickup area, wherein said registration means engages the component by passing through a wall of the component pocket tape.

16. A method for automated feeding of components wherein the components are supplied in a continuous strip of component pocket tape, comprising the steps of:

advancing the continuous strip of component pocket tape to position an individual pocket of the component pocket tape in the vicinity of a component pickup area; and aligning the component within a pocket to a known position at said component pickup area, wherein said step of aligning the component to a known position comprises engaging the component with a registration means by passing the registration means through a wall of the component pocket tape.

* * * * *